United States Patent
Saito et al.

[19]

[11] Patent Number: 6,087,698
[45] Date of Patent: *Jul. 11, 2000

[54] SEMICONDUCTOR DEVICE AND METHOD OF MANUFACTURING THE SAME

[75] Inventors: Tomohiro Saito; Minoru Takahashi; Atsushi Yagishita, all of Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/828,289

[22] Filed: Mar. 21, 1997

Related U.S. Application Data

[62] Division of application No. 08/568,973, Dec. 7, 1995, Pat. No. 5,650,339.

[30] Foreign Application Priority Data

Dec. 8, 1994 [JP] Japan ................................. 6-304959
Sep. 8, 1995 [JP] Japan ................................. 7-231628

[51] Int. Cl.$^7$ ...................... H01L 31/0376; H01L 29/76; H01L 27/01; H01L 31/036
[52] U.S. Cl. .............................. 257/347; 257/57; 257/59; 257/66; 257/351
[58] Field of Search .................................... 257/347–354, 257/900, 383, 66–72, 57–59; 438/162–165, 407

[56] References Cited

U.S. PATENT DOCUMENTS

| | | | |
|---|---|---|---|
| 4,523,963 | 6/1985 | Ohta et al. | |
| 5,120,667 | 6/1992 | Tarui et al. | 257/66 |
| 5,188,973 | 2/1993 | Omura et al. | 437/40 |
| 5,294,823 | 3/1994 | Eklund et al. | 257/374 |
| 5,327,001 | 7/1994 | Wakai et al. | 257/354 |
| 5,396,099 | 3/1995 | Kitajima | 257/352 |
| 5,459,347 | 10/1995 | Omura et al. | 257/347 |
| 5,482,871 | 1/1996 | Pollack | 257/66 |
| 5,482,877 | 1/1996 | Rhee . | |
| 5,488,004 | 1/1996 | Yang | 438/162 |
| 5,493,130 | 2/1996 | Dennison et al. | 257/900 |
| 5,494,837 | 2/1996 | Subramanian et al. | 437/34 |
| 5,518,949 | 5/1996 | Chen | 437/62 |
| 5,541,434 | 7/1996 | Nicholl et al. | 257/383 |
| 5,591,988 | 1/1997 | Arai et al. | 257/66 |
| 5,663,586 | 9/1997 | Lin | 257/900 |

OTHER PUBLICATIONS

K. Shibahara, et al., "Trench Isolation with ∇ (NABLA)–Shaped Buried Oxide for 256Mega–Bit Drams", *IEDM Technical Digest*, 1992, pp. 275–278.

*Primary Examiner*—Minh Loan Tran
*Assistant Examiner*—Cuong Quang Nguyen
*Attorney, Agent, or Firm*—Oblon, Spivak, McClelland, Maier & Neustadt, P.C.

[57] ABSTRACT

A semiconductor device includes an underlying layer formed by a first insulation layer, a plurality of island semiconductor layers formed on the first insulation layer, source and drain regions formed in each of the island semiconductor layers, a first gate electrode formed between the source and drain regions and formed on and insulated from the island semiconductor layer, a second insulation layer formed on the sides of the island semiconductor layer and along the periphery of the first gate electrode, the second insulation layer being higher than the surface of the island semiconductor layer and lower than the surface of the first gate electrode, and a second gate electrode formed over both the first gate electrode and the second insulation layer.

7 Claims, 9 Drawing Sheets

SEMICONDUCTOR DEVICE AND METHOD OF MANUFACTURING THE SAME

This is a Division of application Ser. No. 08/568,973 filed on Dec. 7, 1995 now U.S. Pat. No. 5,650,339.

BACKGROUND OF THE INVENTION

1. Field of the Invention

The present invention relates to a semiconductor device and a method of manufacturing the same and, more particularly, to a semiconductor device using an SOI (Silicon on Insulator) substrate and a method of manufacturing the same.

2. Description of the Related Art

Recently an LSI (Large Scale Integrated Circuit) wherein a large number of transistors, resistors, etc. are formed integrally on a single chip to constitute an electric circuit, has recently been used widely in portions essential to a computer and a communication apparatus. Thus, the performance of the entire computer or apparatus greatly depends upon that of an LSI included therein.

The performance of an LSI itself can be improved by the use of, e.g., an SOI substrate which is excellent in element separation. If an element separating groove is formed in the vicinity of an element forming region to such a depth as to reach a silicon oxide layer (buried oxide layer) of the SOI substrate, the element separation can be greatly improved and the parasitic capacitance can be greatly diminished, as compared with the case of using a silicon substrate.

However, a conventional MOS transistor wherein a mesa element separation is performed using an SOI substrate, has the following drawbacks.

That is, since electric fields are concentrated on a thin silicon oxide layer at the end of an element separating or isolation region at the edge of a channel region of the MOS transistor in the direction of the channel width by the voltage (gate voltage) applied to the gate of the transistor, a parasitic transistor occurs and thus a sub-threshold coefficient (S coefficient) varies. The concentration of electric fields causes a breakdown on the silicon oxide layer.

To resolve the above drawbacks, a technique of forming a thicker side-wall insulating layer at the end of an element separating region is developed (it is disclosed in, for example, Jpn. Pat. Appln. KOKAI Publication No. 6-268224). According to this technique, since a monocrystal silicon layer formed at the end of the element separating region is covered with a thicker silicon oxide layer (side-wall insulating layer), a parasitic transistor and an insulation breakdown can be prevented from being caused due to the concentration of electric fields, unlike the case where the monocrystal silicon is covered with a thin silicon oxide layer.

The inventors have found that the above technique has the following problems.

It is desirable to normally use a silicon oxide layer as a buried insulating layer and also do a silicon oxide layer having a small dielectric constant as a side-wall insulating layer in order to mitigate the concentration of electric fields. In the step of etching the entire surface of the structure, therefore, the silicon oxide layer serving as a side-wall insulating layer and the silicon oxide layer serving as a buried insulating layer are etched at the same time, and a large underlying layer step is formed. It is thus difficult to form an upper wiring layer such as a gate wiring in the subsequent step. To put it in an extreme way, the silicon oxide layer is etched to the surface of a silicon substrate and, in this case, there is danger that the upper wiring layer will be short-circuited.

Since, furthermore, a gate section is formed after the side-wall insulating layer is formed, the silicon oxide layer is etched in the same step of removing a nature oxide layer from the surface of the monocrystal silicon layer, with the result that the silicon oxide layer is decreased in thickness and the concentration of electric fields cannot be reduced to a desired extent.

SUMMARY OF THE INVENTION

An object of the present invention is to provide a semiconductor device capable of preventing an underlying layer step from being formed by using a side-wall insulation layer on an SOI substrate and decreasing the thickness of the side-wall insulation layer.

According to one aspect of the present invention, there is provided a semiconductor device comprising:

an underlying layer formed by a first insulation layer;

a plurality of island semiconductor layers formed on the first insulation layer;

source and drain regions formed in each of the island semiconductor layers;

a first gate electrode insulatively disposed over each of the island semiconductor layers and between the source and drain regions;

a second insulation layer formed on sides of each of the island semiconductor layers and along a periphery of the first gate electrode, the second insulation layer being higher than a surface of each of the island semiconductor layers; and a second gate electrode formed over both the first gate electrode and the second insulation layer.

According to another aspect of the present invention, there is provided a semiconductor device comprising:

a silicon-on-insulator (SOI) substrate having a laminated structure including a semiconductor substrate, a first insulation layer and a semiconductor layer;

a plurality of island semiconductor layers formed on the first insulation layer by selectively etching the semiconductor layer;

source and drain regions formed in each of the island semiconductor layers;

a first gate electrode insulatively disposed over each of the island semiconductor layers and between the source and drain regions;

a second insulation layer formed on sides of the island semiconductor layers and along a periphery of the first gate electrode, the second insulation layer being higher than a surface of each of the island semiconductor layers; and a second gate electrode formed over both the first gate electrode and the second insulation layer.

According to another aspect of the present invention, there is provided a method of manufacturing a semiconductor device, comprising the steps of:

forming a first insulation layer on a semiconductor substrate and a semiconductor layer on the first insulation layer;

forming a second insulation layer on the first semiconductor layer;

forming a first conductive layer on the second insulation layer;

selectively etching a laminated layer of the semiconductor layer, the second insulation layer and the first conductive layer to form a plurality of island laminated layers each including an island semiconductor layer, a gate insulation layer and a first gate electrode layer corresponding to the semiconductor layer, the second insulation layer and the first conductive layer, respectively;

forming a third insulation layer as a side wall on sides of the island semiconductor layer and along a periphery of the first gate electrode layer, the third insulation layer being higher than a surface of each of the island semiconductor layers; and forming a second gate electrode layer over both the first gate electrode layer and the third insulation layer; and forming source and drain regions in the island semiconductor layer.

According to another aspect of the present invention, there is provided a method of manufacturing a semiconductor device, comprising the steps of:

forming on a semiconductor substrate a first insulation layer and a first semiconductor layer on the first insulation layer;

forming a second insulation layer on the first semiconductor layer;

forming a first conductive layer on the second insulation layer;

selectively etching a laminated layer of the first semiconductor layer, the second insulation layer and the first conductive layer to form a plurality of island laminated layers each including an island semiconductor layer, a gate insulation layer and a first gate electrode layer corresponding to the first semiconductor layer, the second insulation layer and the first conductive layer, respectively;

burying a third insulation layer between the plurality of island laminated layers;

forming a second gate electrode layer over both the first gate electrode layer and the third insulation layer; and forming source and drain regions in the island semiconductor layer.

According to another aspect of the present invention, there is provided a method of manufacturing a semiconductor device, comprising the steps of:

forming on a first insulation layer a semiconductor layer, a gate insulation layer and a first conductive layer serving as a first gate electrode which are arranged in this order;

forming a mask pattern on the first conductive layer and, using the mask pattern, selectively removing the first conductive layer, the gate insulation layer and the semiconductor layer by etching, thereby to form an element separating region;

forming a second insulation layer on the element separating region, the second insulation layer being formed on sides of the semiconductor layer and the first conductive layer and being higher than an upper surface of the semiconductor layer and substantially flush with or lower than an upper surface of the first conductive layer;

forming a second conductive layer serving as a second gate electrode all over a region including the first conductive layer and the second insulation layer, and etching a laminated layer of the first conductive layer and the second conductive layer, thereby to form a gate electrode including the first gate electrode and the second gate electrode; and forming source and drain regions in the semiconductor layer.

According to another aspect of the present invention, there is provided a method of manufacturing a semiconductor device, comprising the steps of:

forming an island element section by laminating a semiconductor layer, a gate insulation layer, and a first conductive layer serving as a first gate electrode layer which are arranged in this order on a first insulation layer;

forming a second insulation layer all over the first insulation layer including the island element section, the second insulation layer being thinner than the semiconductor layer;

forming a third insulation layer all over the second insulation layer, the third insulation layer being different in etching rate from the second insulation layer;

etching an entire surface of the third insulation layer under a condition that the etching rate of the second insulation layer is lower than that of the third insulation layer, to selectively leave the third insulation layer so as to surround the sides of the element section through the second insulation layer without exposing a surface of the first insulation layer, the third insulation layer being projected from the semiconductor layer;

removing the second insulation layer from the first gate electrode by etching under a condition that the etching rate of the second insulation layer is higher than that of the third insulation layer;

forming a second conductive layer serving as a second gate electrode all over a region including the element section and then etching a laminated layer of the second conductive layer and the first conductive layer, thereby to form a laminated gate electrode including the first gate electrode and the second gate electrode; and forming source and drain regions in the semiconductor layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A first embodiment of the present invention will now be described with reference to FIGS. 1A to 1D.

Figure 1A:
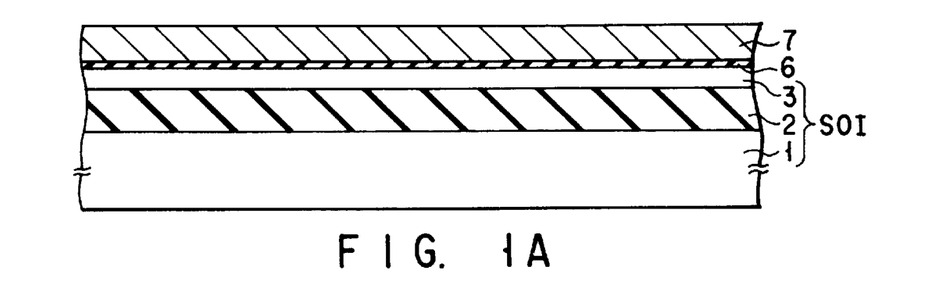
FIGS. 1A to 1D are cross-sectional views of the semiconductor structure of an n-type MOS transistor manufactured by a method of manufacturing a semiconductor device according to a first embodiment of the present invention.

First, as shown in FIG. 1A, an SOI substrate having a laminated structure is prepared. The SOI substrate is formed by, e.g., SIMOX (Separation by Implanted Oxygen) as follows. Oxygen is ion-implanted into a monocrystal silicon substrate 1 and a heat treatment is performed, to form a silicon oxide layer 2 having a thickness of about 80 nm therein to the depth of about 100 nm from the surface of the substrate 1. The surface portion of the substrate 1 then remains on the silicon oxide layer 2 as a silicon layer 3.

After a native oxide layer is removed from the surface of the silicon layer 3, a gate oxide layer 6 of 10 nm in thickness is formed on the silicon layer 3, and a boron-doped polysilicon layer 7 of 150 nm in thickness, which serves as a first gate electrode, is formed on the gate oxide layer 6. When the need arises, impurity ions are introduced into the silicon layer 3 by ion implantation and the like in order to form a channel region (The same is true of the subsequent embodiments).

Figure 1B:
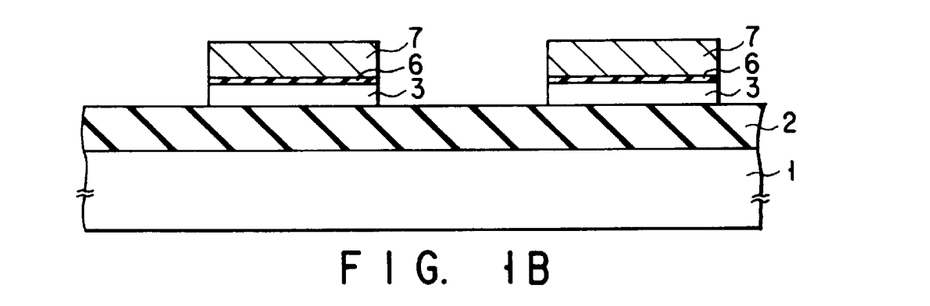

Referring to FIG. 1B, a resist pattern (not shown) for forming an element region is formed on the boron-doped polysilicon layer 7. Using the resist pattern as a mask, the layers 7, 6 and 3 are etched by RIE (Reactive Ion Etching) and selectively removed from an element separation region. After that, the resist pattern is separated.

Figure 1C:
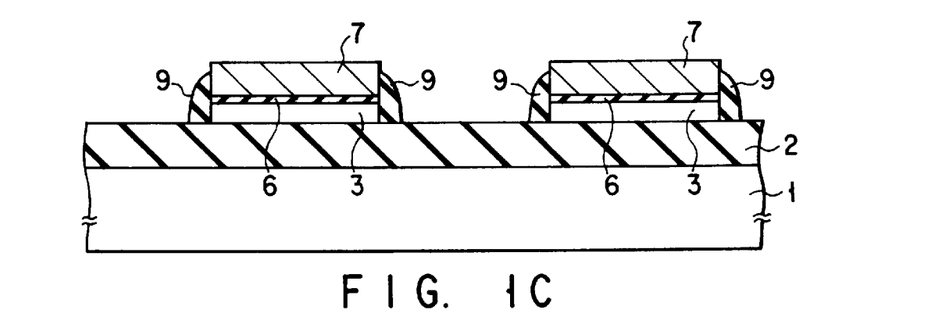

As shown in FIG. 1C, a silicon nitride layer is formed on the entire surface of the semiconductor structure, obtained by the step shown in FIG. 1B, by LPCVD (low pressure CVD). The silicon nitride layer is etched back by RIE thereby to form a side-wall insulation layer 9 surrounding the boron-doped polysilicon layer 7. This layer 9 functions as an element separating insulation layer. The etch-back of the silicon nitride layer is so controlled that the side-wall insulation layer 9 is lower than the upper surface of the layer 7 and higher than the layer 3. Therefore, the height of the layer 9 can vary according to the thickness of the layer 7.

In the above embodiment, a silicon oxide layer may be used as the side-wall insulation layer 9. In this case, since the side-wall insulation layer 9 is formed after the gate oxide layer 6 and boron-doped polysilicon layer 7 are done, the steps wherein the side-wall insulation layer 9 is exposed to $NH_4F$ and HF can be decreased. Therefore, the silicon layer 3 can be maintained at the end of the element separation region without reducing the layer 9, and the elements can be reliably separated.

Figure 1D:
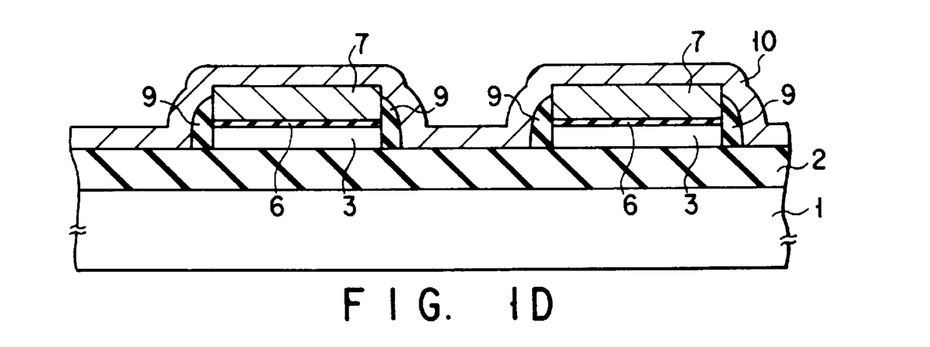

As illustrated in FIG. 1D, a WSi layer 10 serving as a second gate electrode is formed on the entire surface of the semiconductor structure obtained by the step shown in FIG. 1C. The second gate electrode is connected to the first gate electrode of another MOSFET.

According to the first embodiment, the edge corners of the silicon layer 3 and the polysilicon layer (gate electrode) 7, which face the gate oxide layer 6, are completely covered with the side-wall insulation layer 9. It is thus possible to prevent the S coefficient from varying and prevent a breakdown from being caused at the end of the element separation region.

Then, a resist pattern (not shown) is formed on the WSi layer 10 and, using this pattern as a mask, the WSi layer 10 and boron-doped polysilicon layer 7 are continuously etched such that the boundaries between the layer 7 and the layers 9 and 10 remain. As a result, a laminated gate electrode including the layers 7 and 10 is obtained.

Figure 2A:
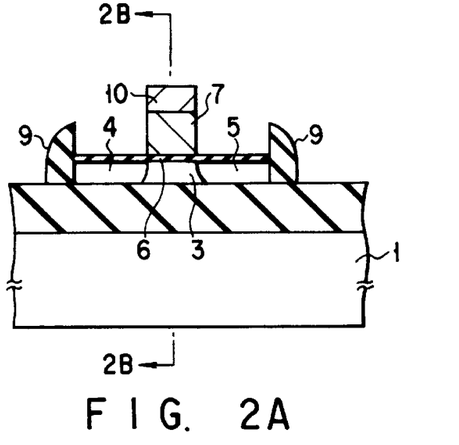
FIGS. 2A, 2B and 2C are a cross-sectional views of the semiconductor structure of the n-type MOS transistor manufactured by the method according to the first embodiment of the present invention, a cross-sectional view thereof along a 2B—2B line of FIG. 2A, and a perspective view thereof.
Figure 2B:
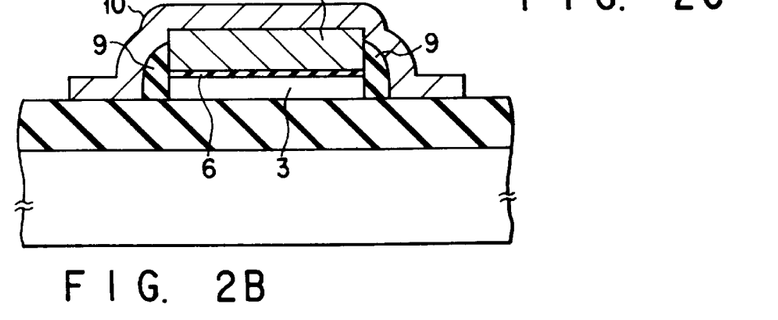
Figure 2C:
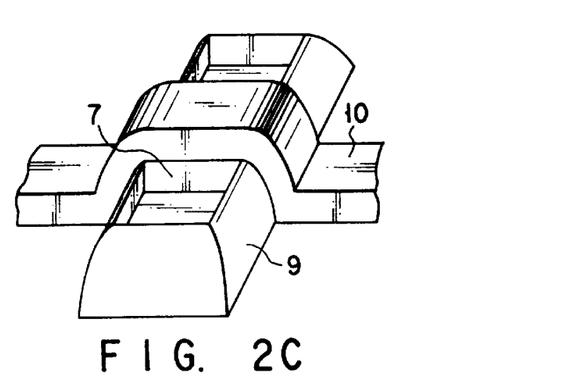

After the resist pattern is eliminated, n-type impurities (e.g., arsenic) are ion-implanted into the silicon layer 3 using the gate electrode as a mask. Source and drain regions 4 and 5 are formed in a self-alignment manner to reach the silicon oxide layer 2. Thus, an n-type MOS transistor surrounded by the side-wall insulation layer 9 can be fabricated as shown in FIGS. 2A to 2C.

Finally, the n-type MOS transistor is completed by forming a contact hole and an aluminum wiring layer in accordance with a normal manufacturing method.

Figure 3:
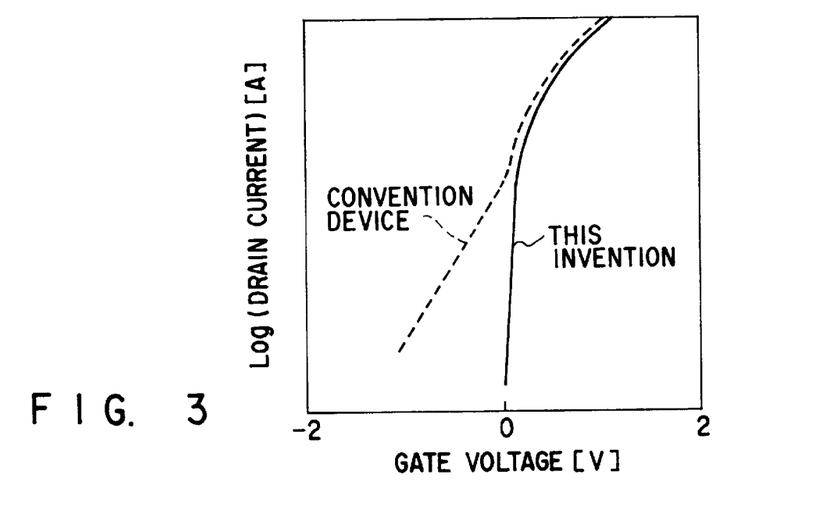
FIG. 3 is a graph showing the relationship between gate voltage and drain current which represents the advantage of the present invention.

As seen from FIG. 3 showing the relationship in characteristics between the gate voltage and drain current, an inclined dotted line indicative of the drain current due to a parasitic transistor caused in the prior art can be suppressed by the present invention.

The n-type MOS transistor of the first embodiment is manufactured by the method wherein the first gate electrode is formed before the side-wall insulation layer is done, that is, a gate preforming process. The gate preforming process matches a process using an SOI substrate and not a well separating process. The reason therefor is as follows.

Since the ion implantation for forming wells is performed before the first gate electrode is formed, n-type impurities in an n-type well and p-type impurities in a p-type well are mixed in the subsequent element separating process or the like, and small wells cannot be separated. On the other hand, in the process using the SOI substrate, since no wells have to be separated in virtue of an SOI insulation layer, no problems occur.

A method of manufacturing an n-type MOS transistor according to a second embodiment of the present invention will now be described with reference to FIGS. 4A to 4D. In this embodiment, a buried insulation layer is used as a side-wall insulation layer.

Figure 4A:
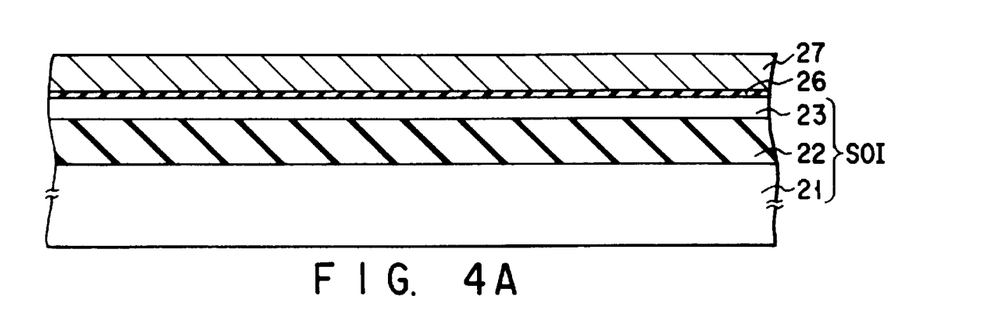
FIGS. 4A to 4D are cross-sectional views showing the semiconductor structure of an n-type MOS transistor manufactured by a method of manufacturing a semiconductor device according to a second embodiment of the present invention.

First, as shown in FIG. 4A, a laminated SOI substrate including a monocrystal silicon substrate 21, a silicon oxide layer (SOI insulation layer) 22 having a thickness of about 80 nm, and a silicon layer (SOI semiconductor layer) 23 having a thickness of about 100 nm, is prepared. This substrate is formed by, e.g., SIMOX as in the first embodiment.

A native oxide layer is removed from the surface of the silicon layer 23, and a gate oxide layer 26 of 10 nm in thickness is formed on the silicon layer 23. Then, a boron-doped polysilicon layer 27 of 150 nm in thickness, which serves as a first gate electrode, is formed on the gate oxide layer 26.

Figure 4B:
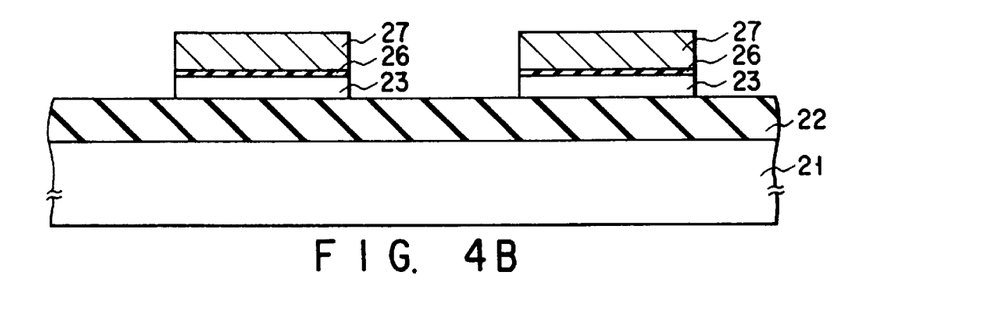

Referring to FIG. 4B, a resist pattern (not shown) for forming an element region is formed on the boron-doped polysilicon layer 27. Using the resist pattern as a mask, the layers 27, 26 and 23 are etched by RIE and selectively removed from an element separation region. After that, the resist pattern is separated.

Figure 4C:
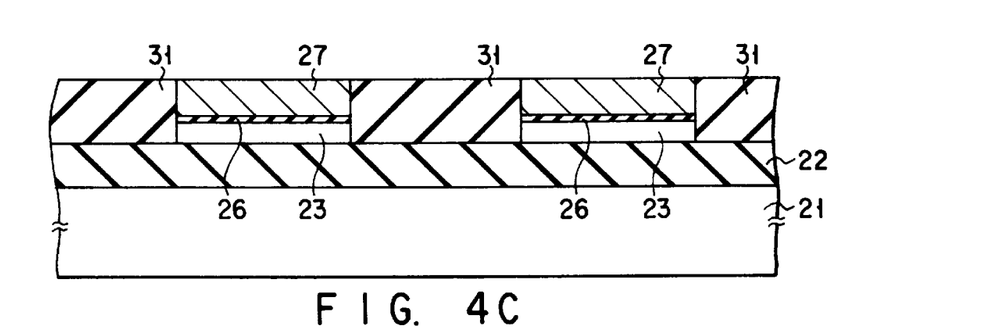

As illustrated in FIG. 4C, a silicon oxide layer having a thickness of about 500 nm is formed on the entire surface of the semiconductor structure shown in FIG. 4B by LPCVD or the like. After that, the silicon oxide layer is flattened by chemical mechanical polishing (CMP) or etch-back and buried into the element separation region, thereby forming a buried insulation layer 31. This layer 31 serves as an element separating insulation layer. It is desirable that the buried insulation layer 31 be flush with the boron-doped polysilicon layer 27.

Figure 4D:
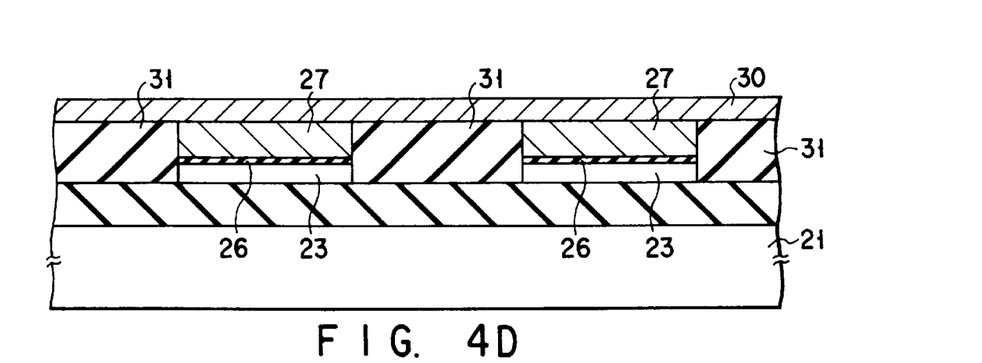

As shown in FIG. 4D, a WSi layer 30 serving as a second gate electrode is formed on the entire surface of the semiconductor structure obtained by the step shown in FIG. 4C. The second gate electrode is connected to the first gate electrode of another MOSFET.

After that, a resist pattern (not shown) is formed on the WSi layer 30 and, using this pattern as a mask, the WSi layer 30 and boron-doped polysilicon layer 27 are etched at once such that the boundaries between the layers 27 and 31 remain, resulting in a laminated gate electrode.

Figure 5A:
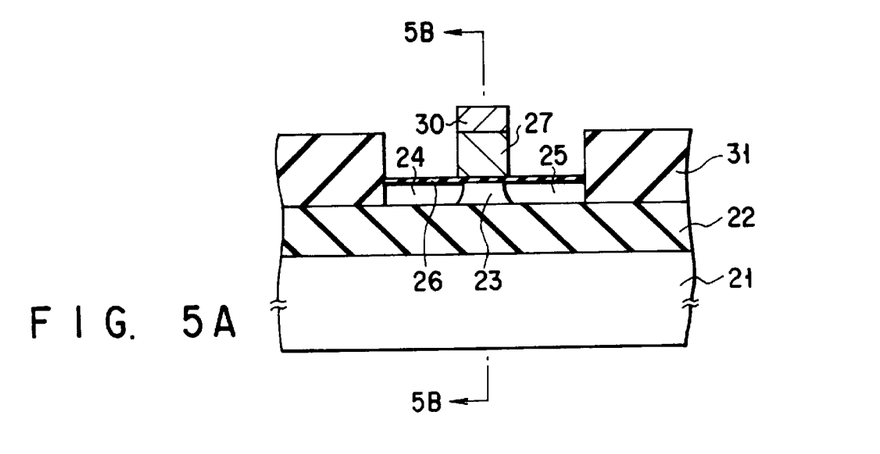
FIGS. 5A and 5B are a cross-sectional view of the semiconductor structure of the n-type MOS transistor manufactured by the method according to the second embodiment of the present invention and a cross-sectional view thereof along a 5B—5B line of FIG. 5A.
Figure 5B:
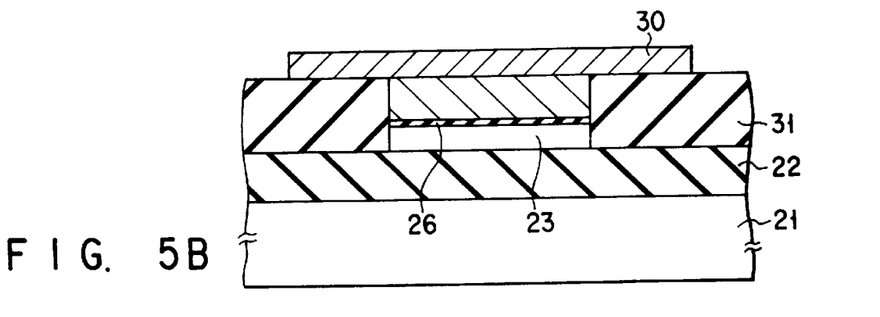

Using the gate electrode as a mask, n-type impurities (e.g., arsenic) are ion-implanted into the silicon layer 23 to form source and drain regions 24 and 25 in a self-alignment manner. Thus, an n-type MOS transistor having a structure as shown in FIGS. 5A and 5B is fabricated.

Finally, the n-type MOS transistor is completed by forming a contact hole and an aluminum wiring layer in accordance with a normal manufacturing method.

Even in the n-type MOS transistor of the second embodiment, the same advantage as that of the first embodiment, i.e., the advantage of preventing a parasitic transistor from occurring and the like can be obtained.

Figure 6:
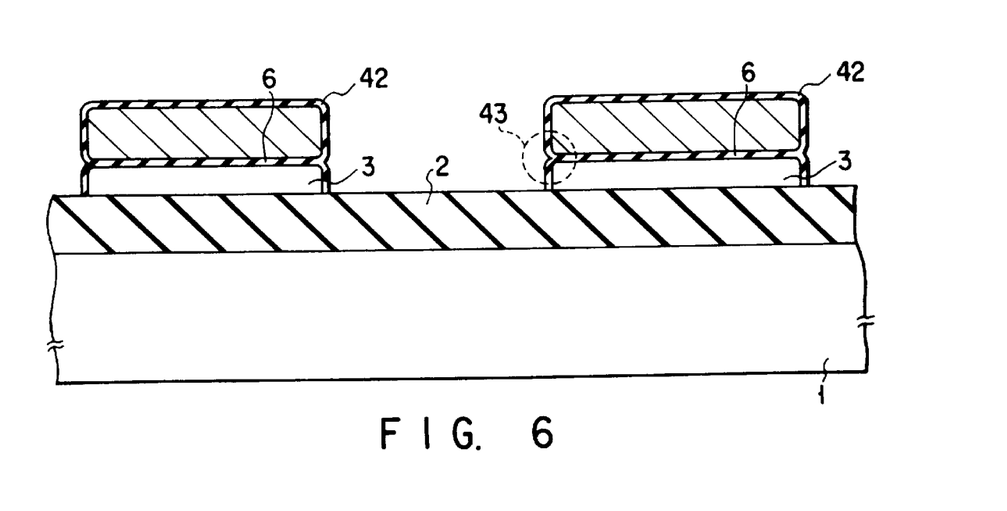
FIG. 6 is a cross-sectional view of an n-type MOS transistor obtained by a method of manufacturing a semiconductor device according to a third embodiment of the present invention.

A method of manufacturing an n-type MOS transistor according to a third embodiment of the present invention will now be described with reference to FIG. 6. FIG. 6 shows a semiconductor structure in one step of manufacturing part of the n-type MOS transistor. In FIG. 6, the same elements as those of the semiconductor structure shown in FIGS. 1A to 1D are indicated by the same reference numerals and their detailed descriptions are omitted.

According to the third embodiment, a thermal oxide layer 42 is formed on the sides of a silicon layer 3 and the surface (top and sides) of a boron-doped polysilicon layer 7 in a step corresponding to that shown in FIG. 1B. The thickness of the layer 42 is set to, for example, about 15 nm.

Since the thermal oxide layer 42 is formed at an element separating region end 43, the corner of the end 43 is rounded and an electric field concentrated on the end 43 can be diminished.

Even though the method according to the third embodiment is applied to the step shown in FIG. 4B, the same advantage as that of the third embodiment can be achieved.

Figure 7:
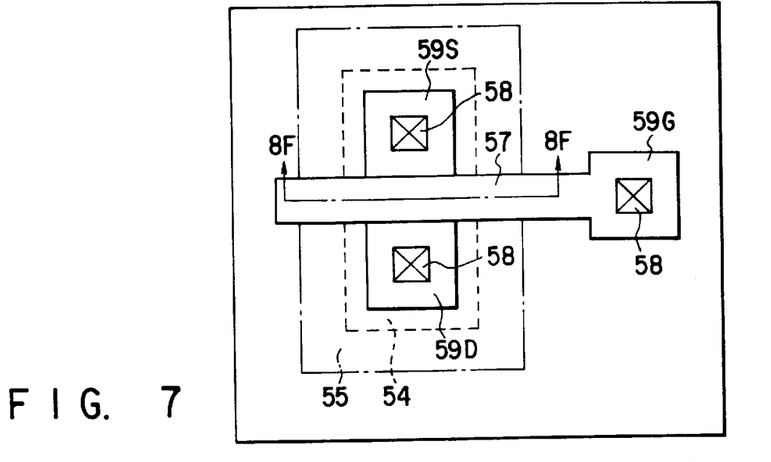
FIG. 7 is a plan view of an n-type MOS transistor obtained by a method of manufacturing a semiconductor device according to a fourth embodiment of the present invention.

A method of manufacturing an n-type MOS transistor according to a fourth embodiment of the present invention will now be described with reference to FIGS. 7 and 8A to 8F. FIGS. 8A to 8F are cross-sectional views taken in parallel to the width direction of a gate of the transistor. In particular, FIG. 8F is a cross-sectional view taken along line 8F—8F of FIG. 7.

Figure 8A:
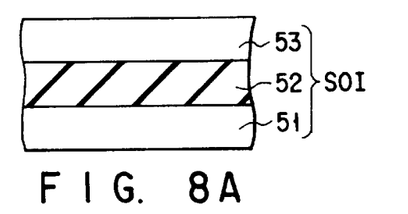
FIGS. 8A to 8F are cross-sectional views showing the semiconductor structure in the manufacturing method shown in FIG. 7.

A laminated SOI substrate including a monocrystal silicon substrate 51, a silicon oxide layer (SOI insulation layer) 52 having a thickness of about 100 nm, and a monocrystal silicon layer (SOI semiconductor layer) 53 having a thickness of about 100 nm, is prepared as shown in FIG. 8A. This substrate is formed by, e.g., SIMOX as in the first embodiment.

Figure 8B:
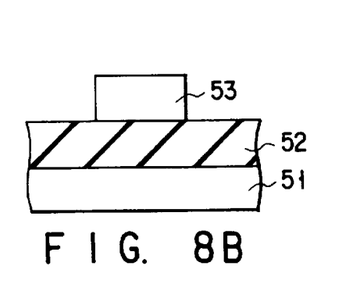

As illustrated in FIG. 8B, the monocrystal silicon layer 53 is patterned by RIE using a resist (not shown) as a mask thereby to form an island element region (element section).

Figure 8C:
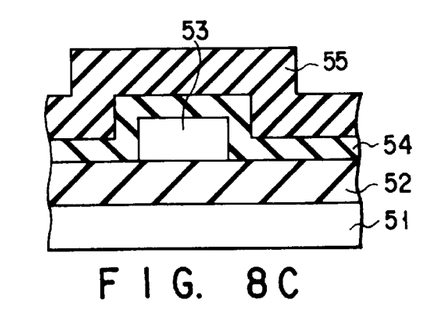

As shown in FIG. 8C, a silicon nitride layer 54 having a thickness of 20 nm is formed by the LPCVD on the entire surface of the semiconductor structure obtained in the step shown in FIG. 8B and then a silicon oxide layer 55 having a thickness of 200 nm is formed on the silicon nitride layer 54 by the CVD.

Figure 8D:
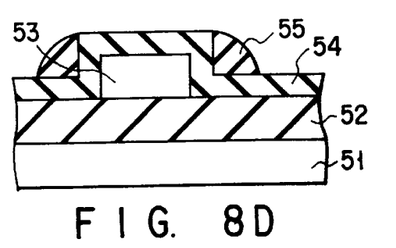

As shown in FIG. 8D, the entire surface of the silicon oxide layer 55 is etched until the surface of the silicon nitride layer 54 is exposed, with the result that the silicon oxide layer 55 selectively remains on the side walls of the island element region. The etching of the silicon oxide layer 55 is performed under the condition that the etching rate of the layer 55 is greater than that of the layer 54. This condition can be met by the use of dry etching such as RIE. As etching gas, a mixture of $CF_4$ and $O_2$, a mixture of $C_4F_8$, CO and Ar, etc. can be employed. Since the silicon oxide layer 52 is not removed by etching, no step occurs on the underlying layer; accordingly, there occurs no problems of making it difficult to form an upper wiring layer such as a gate wiring layer in the subsequent step and short-circuiting the upper wiring layer.

Figure 8E:
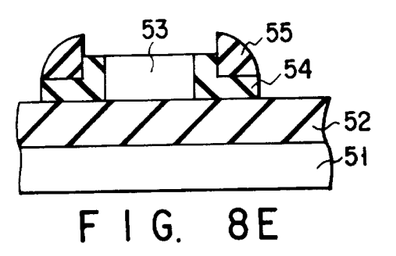
Figure 8F:
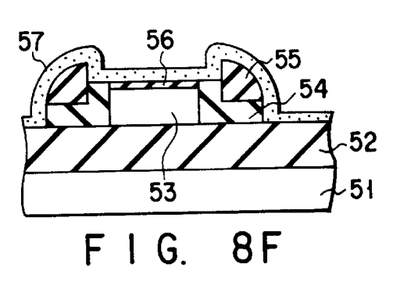

As illustrated in FIG. 8E, both a portion of the silicon nitride layer 54, which is surrounded by the silicon oxide layer 55 and formed on the monocrystal silicon layer 53, and another portion thereof, which is not surrounded by the layer 55 and formed on the silicon oxide layer 52, are removed by etching. The etching of the silicon nitride layer 54 is performed under the condition that the etching rate is greater than that of the layer 55. This condition can be met by, e.g., wet etching using thermal phosphoric acid treatment. Therefore, the silicon oxide layer 55 serving as a side-wall insulation layer can be prevented from decreasing in thickness and remains projected from the monocrystal silicon layer 53.

As shown in FIG. 8F, a gate oxide layer 56 is formed on the surface of the monocrystal silicon layer 53 by thermal oxidation. Thus, that portion of the silicon nitride layer 54 which is formed alongside the monocrystal silicon layer 53, is higher than the layer 53. A gate electrode 57 constituted of, e.g., a boron-doped polysilicon layer is formed on the gate oxide layer 56 so as to cover the layers 54 and 55.

The succeeding process is the same as that of manufacturing a normal MOS transistor. More specifically, using the gate electrode 57 as a mask, n-type impurities (e.g., arsenic) are ion-implanted into the resultant structure to form source and drain regions in a self-alignment manner, and an interlayer insulation layer is formed on the whole surface of the structure. Thereafter, as shown in FIG. 7, a contact hole 58 is formed in the interlayer insulation layer, and a source electrode 59S, a drain electrode 59D and a gate wiring 59G are arranged.

Referring to FIGS. 9A to 9G, a method of manufacturing an n-type MOS transistor according to a fifth embodiment of the present invention will now be described. Like FIGS. 8A to 8F, these figures are cross-sectional views taken in parallel to the width direction of a gate of the transistor.

Figure 9A:
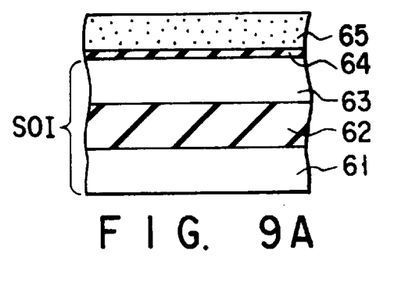
FIGS. 9A to 9G are cross-sectional views showing the semiconductor structure of an n-type MOS transistor manufactured by a method of manufacturing a semiconductor device according to a fifth embodiment of the present invention.

As in the fourth embodiment, a laminated SOI substrate including a monocrystal silicon substrate 61, a silicon oxide layer (SOI insulation layer) 62 having a thickness of about 100 nm, and a monocrystal silicon layer (SOI semiconductor layer) 63 having a thickness of about 100 nm, is prepared in the step shown in FIG. 9A. A buffer silicon oxide layer 64 having a thickness of 10 nm is formed on the monocrystal silicon layer 63 and then a polysilicon layer 65 having a thickness of 200 nm is formed on the layer 64 by the LPCVD. After that, a photoresist pattern (not shown) is formed on the layer 65.

Figure 9B:
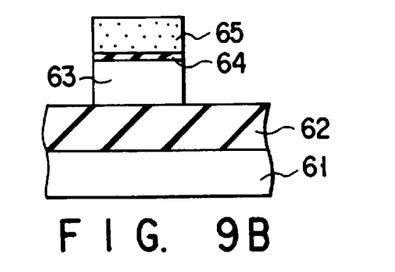

As illustrated in FIG. 9B, the layers 65, 64 and 63 are etched by the RIE using the photoresist pattern as a mask thereby to form an island element region (element section).

Figure 9C:
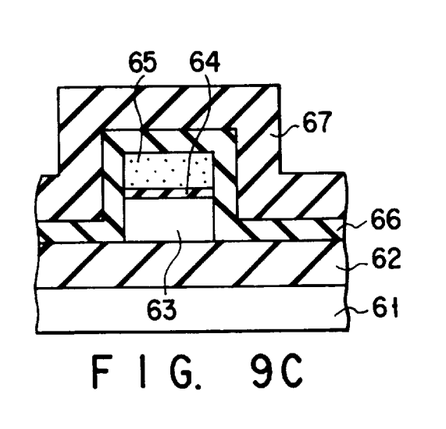

As shown in FIG. 9C, a silicon nitride layer 66 having a thickness of 50 nm is formed by the LPCVD on the entire surface of the semiconductor structure shown in FIG. 9B and then a silicon oxide layer 67 having a thickness of 200 nm is formed on the silicon nitride layer 66 by the CVD.

Figure 9D:
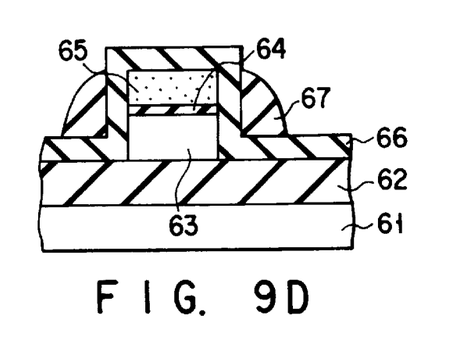

As shown in FIG. 9D, the whole surface of the silicon oxide layer 67 is etched to selectively leave it on the side walls of the island element region. Like in the fourth embodiment, the etching of the silicon oxide layer 67 is performed under the condition that the etching rate of the layer 67 is greater than that of the layer 66. This condition can be met by the use of dry etching such as RIE. Since the silicon oxide layer 62 is not removed by etching, no step occurs on the underlying layer, accordingly, there occurs no problems of making it difficult to form an upper wiring layer such as a gate wiring layer in the subsequent step and short-circuiting the upper wiring layer.

Figure 9E:
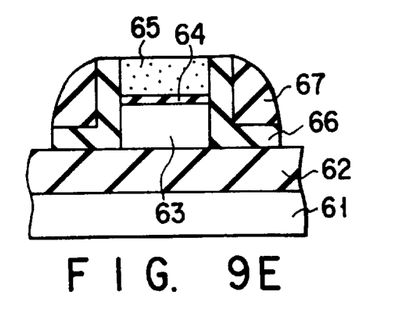

As illustrated in FIG. 9E, both a portion of the silicon nitride layer 66, which is surrounded by the silicon oxide layer 67 and formed on the polysilicon layer 65, and another portion thereof, which is not surrounded by the layer 67 and formed on the silicon oxide layer 62, are removed by etching. As in the fourth embodiment, the etching of the silicon nitride layer 66 is performed under the condition that the etching rate is greater than that of the layer 67. This condition can be met by dry etching such as chemical dry etching (CDE). As etching gas, a mixture of $CF_4$ and $Cl_2$, a mixture of $CF_4$ and $H_2O$ can be employed. Though the polysilicon layer 65 may also be etched to decrease in thickness because of the dry etching, the performance of the transistor is not affected.

Figure 9F:
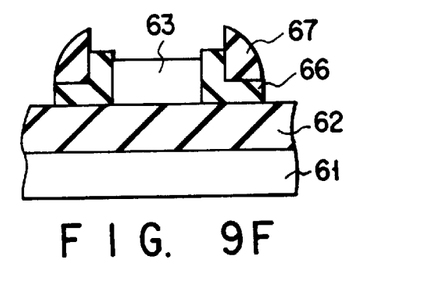

As shown in FIG. 9F, the polysilicon layer 65 and buffer silicon oxide layer 64 are eliminated. In this case, that portion of the silicon nitride layer 66 which is formed alongside the monocrystal silicon layer 63 can be removed, but it has to be done such that its level becomes higher than the upper surface of the layer 63.

Figure 9G:
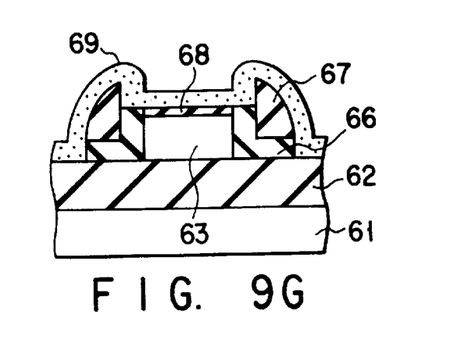

Thereafter, as shown in FIG. 9G, a gate oxide layer 68 is formed on the surface of the monocrystal silicon layer 63. A gate electrode 69 constituted of, e.g., a boron-doped polysilicon layer is formed on the gate oxide layer 68 so as to cover the layers 66 and 67. Like in the fourth embodiment, the succeeding process is the same as that of manufacturing a normal MOS transistor. More specifically, using the gate electrode 69 as a mask, n-type impurities (e.g., arsenic) are ion-implanted into the resultant structure to form source and drain regions in a self-alignment manner, and an interlayer insulation layer is formed on the whole surface of the structure. Thereafter, a contact hole is formed in the interlayer insulation layer, and a source electrode, a drain electrode and a gate wiring are arranged.

Referring to FIGS. 10A to 10G, a method of manufacturing an n-type MOS transistor according to a sixth embodiment of the present invention will now be described. Like FIGS. 8A to 8F, these figures are cross-sectional views taken in parallel to the width direction of a gate of the transistor.

Figure 10A:
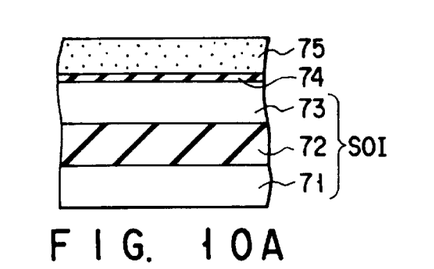
FIGS. 10A to 10F are cross-sectional views and perspective view showing the semiconductor structure of an n-type MOS transistor in a method of manufacturing a semiconductor device according to a sixth embodiment of the present invention, respectively.

As in the fourth embodiment, a laminated SOI substrate including a monocrystal silicon substrate 71, a silicon oxide layer (SOI insulation layer) 72 having a thickness of about 100 nm, and a monocrystal silicon layer (SOI semiconductor layer) 73 having a thickness of about 100 nm, is prepared in the step shown in FIG. 10A. A gate oxide layer 74 having a thickness of 20 nm is formed on the monocrystal silicon layer 73 and then a boron-doped polysilicon layer 75 having a thickness of 200 nm is formed by the LPCVD on the layer 74 as a first gate electrode.

Figure 10B:
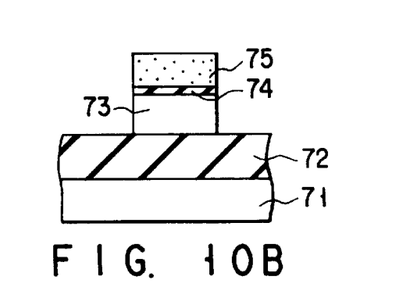

As illustrated in FIG. 10B, the layers 75, 74 and 73 are etched by the RIE using a photoresist pattern (not shown) as a mask thereby to form an island element region (element section).

Figure 10C:
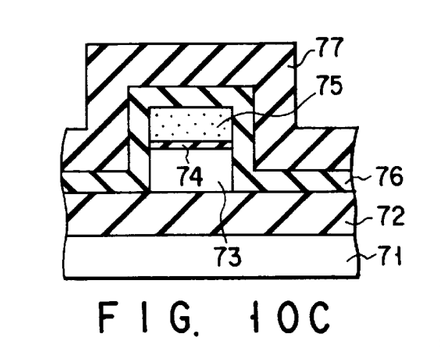

As shown in FIG. 10C, a silicon nitride layer 76 having a thickness of 50 nm is formed by the LPCVD on the entire surface of the semiconductor structure shown in FIG. 10B and then a silicon oxide layer 77 having a thickness of 200 nm is formed on the silicon nitride layer 76 by the CVD.

Figure 10D:
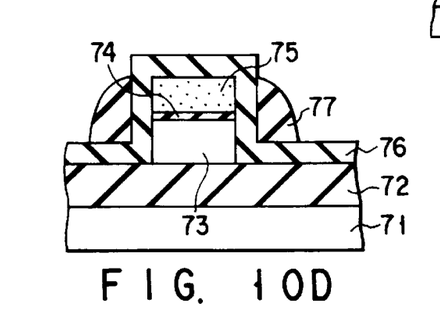

As shown in FIG. 10D, in order to form a side-wall insulation layer, the whole surface of the silicon oxide layer 77 is etched to selectively leave it on the side walls of the island element region. The layer 77 is formed so as to protrude from the monocrystal silicon layer 73.

Like in the previous embodiments, the etching of the silicon oxide layer 77 is performed under the condition that the etching rate of the layer 77 is greater than that of the layer 76. This condition can be met by the use of dry etching such as RIE. Since the silicon oxide layer 72 is not removed by etching, no step occurs on the underlying layer, accordingly, there occurs no problems of making it difficult to form an upper wiring layer such as a gate wiring layer in the subsequent step and short-circuiting the upper wiring layer.

Furthermore, since the sides of the gate oxide layer 74 and their nearby portions are covered with the silicon nitride layer 76, they can be prevented from being damaged when the silicon oxide layer 77 is etched.

Figure 10E:
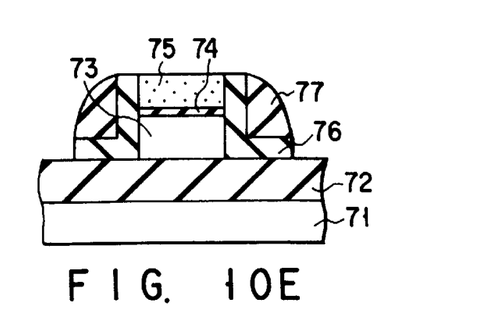

As illustrated in FIG. 10E, both a portion of the silicon nitride layer 76, which is surrounded by the silicon oxide layer 77 and formed on the boron-doped polysilicon layer 75, and another portion thereof, which is not surrounded by the layer 77 and formed on the silicon oxide layer 72, are removed by etching. As in the previous embodiments, the etching of the silicon nitride layer 76 is performed under the condition that the etching rate is greater than that of the layer 77. This condition can be met by dry etching such as CDE. Though the boron-doped polysilicon layer 75 may also be etched to decrease in thickness because of the dry etching, the performance of the transistor is not affected.

Figure 10F:
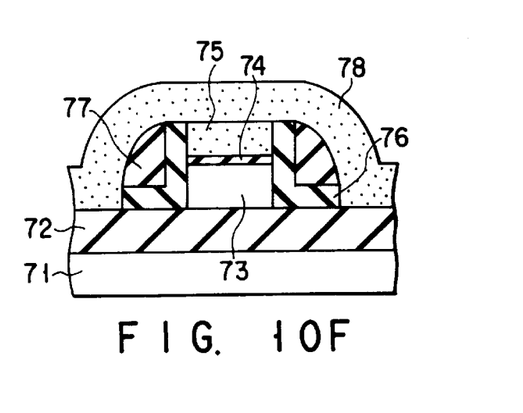
Figure 10G:
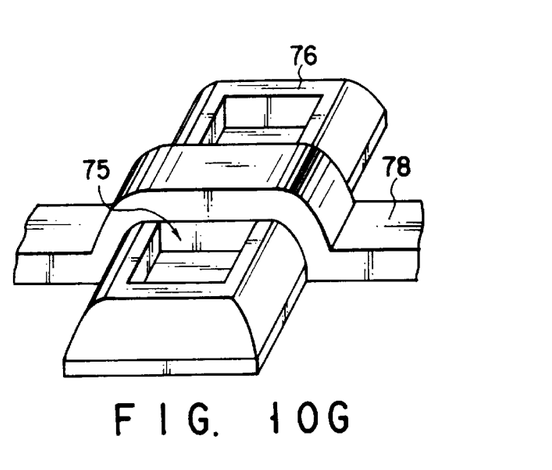
FIG. 10G is a perspective view of the FIG. 10F semiconductor structure.

As shown in FIG. 10F, a boron-doped polysilicon layer 78 serving as a second gate electrode is formed on the first gate electrode 75 so as to cover the layers 76 and 77, resulting in an n-type MOS transistor surrounded by the layers 76 and 77 as shown in FIG. 10G.

According to the sixth embodiment, since the silicon oxide layer 77 serving as a side-wall insulation layer is formed after the gate oxide layer 74 and the boron-doped polysilicon layer 75 are done, it is not thinned in the step of eliminating a native oxide layer before the layer 77 is formed. Consequently, the thickness of the layer 77 can be maintained, and the problems of concentration of electric field and the like can easily be resolved.

Like in the fourth embodiment, the succeeding process is the same as that of manufacturing a normal MOS transistor. More specifically, using the second gate electrode 78 as a mask, n-type impurities (e.g., arsenic) are ion-implanted into the resultant structure to form source and drain regions in a self-alignment manner, and an interlayer insulation layer is formed on the whole surface of the structure. Thereafter, a contact hole is formed in the interlayer insulation layer, and a source electrode, a drain electrode and a gate wiring are arranged.

Figure 11:
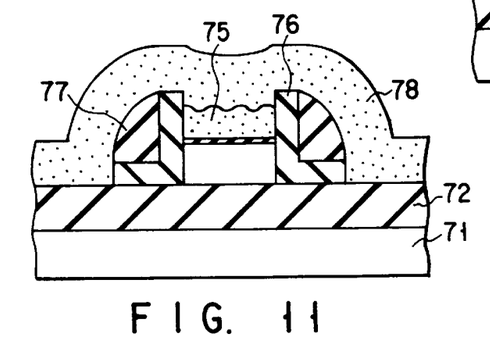
FIG. 11 is a cross-sectional view showing the semiconductor structure wherein a first gate electrode is over-etched.

FIG. 11 shows a semiconductor structure wherein the first gate electrode 75 is over-etched and its upper portion is formed lower than the silicon nitride layer 76 and silicon oxide layer 77. In this structure, the second gate electrode 78 is formed so as to enter a hollow defined by the first gate electrode 75 and silicon nitride layer 76. In this structure, the electric characteristics of the transistor is not affected.

Figure 12:
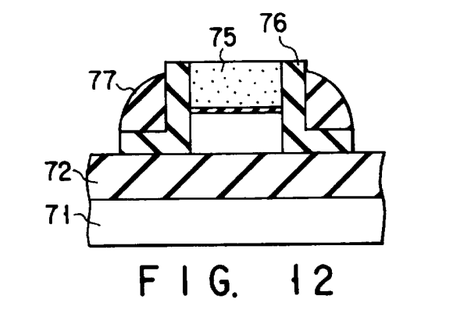
FIG. 12 is a cross-sectional view showing the semiconductor structure wherein a silicon oxide layer is over-etched more than a silicon nitride layer.

FIG. 12 shows a semiconductor structure wherein the silicon oxide layer 77 is over-etched by the electrode is formed so as to cover the silicon oxide layer 77, silicon nitride layer 76 and first gate electrode 75.

Figure 13:
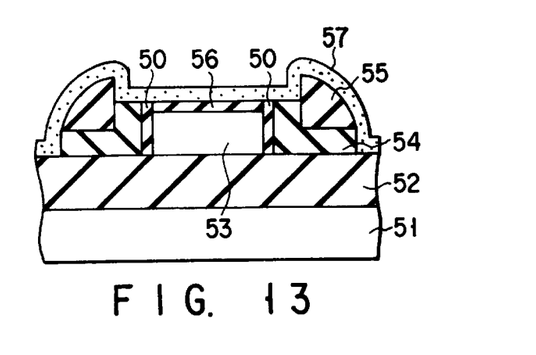
FIG. 13 is a cross-sectional view of an n-type MOS transistor obtained by a method of manufacturing a semiconductor device according to a seventh embodiment of the present invention.

A method of manufacturing an n-type MOS transistor according to a seventh embodiment of the present invention will now be described with reference to FIG. 13. The steps of the seventh embodiment are the same as those of the fourth embodiment, except that, as shown in FIG. 13, a thin silicon oxide layer 50 having a thickness of about 10 nm is provided between a silicon nitride layer 54 and a monocrystal silicon layer 53. This silicon oxide layer 50 can be obtained by thermally oxidizing the whole surface of the monocrystal silicon layer 53 in the step shown in FIG. 8B. The layer 50 enhances close adhesion between the layers 53 and 55. Since the silicon oxide layer 50 is formed by thermal oxidation, the corners of the silicon layer 53 are rounded; thus, the concentration of electric fields can be mitigated.

Figure 14:
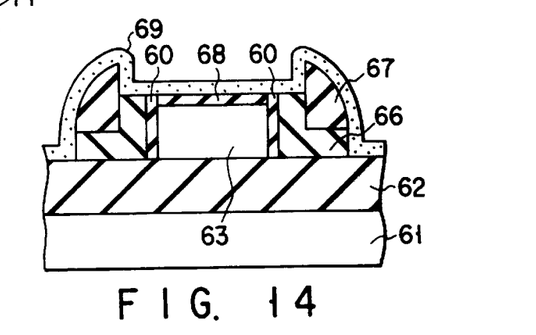
FIG. 14 is a cross-sectional view of an n-type MOS transistor obtained by a method of manufacturing a semiconductor device according to an eighth embodiment of the present invention.

A method of manufacturing an n-type MOS transistor according to an eighth embodiment of the present invention, will now be described with reference to FIG. 14. The steps of the eighth embodiment are the same as those of the fifth embodiment, except that, as shown in FIG. 14, a thin silicon oxide layer 60 having a thickness of about 10 nm is provided between a silicon nitride layer 66 and a monocrystal silicon layer 63. This silicon oxide layer 60 can be obtained by thermally oxidizing the whole surface of the monocrystal silicon layer 63 and boron-doped polysilicon layer 65 in the step shown in FIG. 9B. The silicon oxide layer 60 is removed by etching from the polysilicon layer 65 after the step of eliminating the silicon nitride layer in FIG. 9E. In the eighth embodiment, too, the same advantage as that of the seventh embodiment can be obtained.

Figure 15:
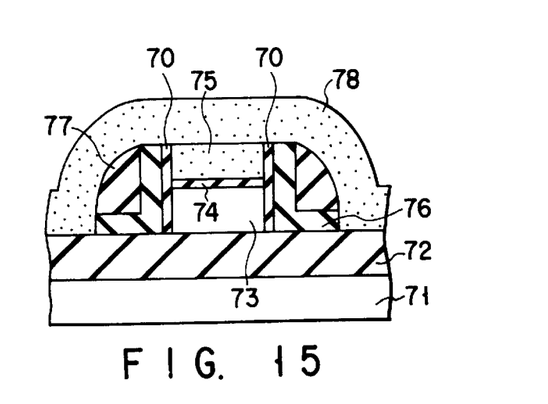
FIG. 15 is a cross-sectional view of an n-type MOS transistor obtained by a method of manufacturing a semiconductor device according to a ninth embodiment of the present invention.

A method of manufacturing an n-type MOS transistor according to a ninth embodiment of the present invention, will now be described with reference to FIG. 15. The steps of the ninth embodiment are the same as those of the sixth embodiment, except that, as shown in FIG. 15, a thin silicon oxide layer 70 having a thickness of about 10 nm is provided inside a silicon nitride layer 77. The silicon oxide layer 70 contacts the monocrystal silicon layer 73, gate oxide layer 74 and first gate electrode 75. This layer 70 can be obtained by thermally oxidizing the whole surface of the monocrystal silicon layer 73 and boron-doped polysilicon layer 75 in the step shown in FIG. 10B. The silicon oxide layer 70 is removed by etching from the polysilicon layer 75 after the step of eliminating the silicon nitride layer in FIG. 10E. In the ninth embodiment, too, the same advantage as that of the seventh embodiment can be obtained.

A method of manufacturing an n-type MOS transistor according to a tenth embodiment of the present invention, will now be described with reference to FIGS. 16A and 16B.

As described above, it is important to form an etching protection layer for protecting an underlying buried insulating layer when a side-wall insulating layer is etched. In the tenth embodiment, therefore, such an etching protection layer is provided between a buried insulating layer formed on the semiconductor substrate and an SOI semiconductor layer.

Figure 16A:
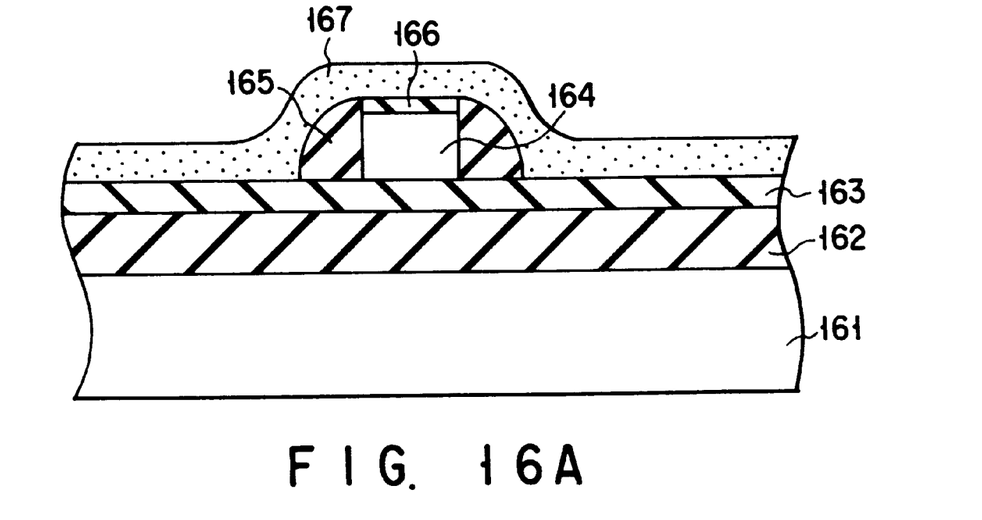
FIGS. 16A and 16B are cross-sectional views showing the semiconductor structure of an n-type MOS transistor manufactured by a method of manufacturing a semiconductor device according to a tenth embodiment of the present invention.

Referring to FIG. 16A, a silicon oxide layer 162 is formed as a buried insulating layer on the monocrystal silicon substrate 161, and a silicon nitride film 163 is formed as the above etching protection film on the silicon oxide layer 162.

Moreover, a monocrystal silicon layer 164 serving as an element region is selectively formed on the silicon nitride layer 163, and a silicon oxide layer 166 serving as a gate insulation layer is formed on the layer 164 and a silicon oxide layer 165 serving as a side-wall insulation layer is formed on the side wall thereof. A boron-doped polysilicon layer 167 serving as a gate electrode wiring is formed so as to extend over the silicon oxide layers 166 and 165 and silicon nitride layer 163.

According to the transistor structure shown in FIG. 16A, when the silicon oxide layer 165 is etched by the RIE or the like to leave it on the side wall of the monocrystal silicon layer 164, the silicon nitride layer 163 functions as an etching protection layer, and an underlying layer step can be prevented from being caused due to a decrease in thickness of the silicon oxide layer 162 by etching.

Figure 16B:
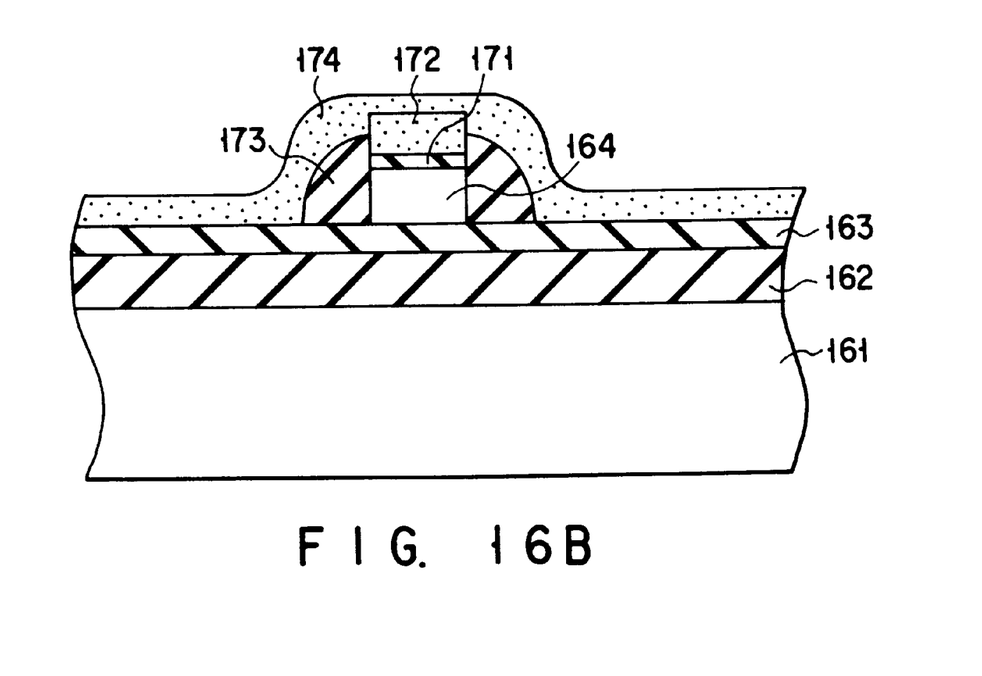

The transistor structure shown in FIG. 16B corresponds to those of the first and third embodiments. In FIG. 16B, the same elements as those of the structure shown in FIG. 16A are indicated by the same reference numerals. The structure shown in FIG. 16B is achieved by the following process.

A laminated layer containing a monocrystal silicon layer 164, a silicon oxide layer (gate insulation layer) 171 and a boron-doped polysilicon layer (gate electrode) 172 is etched. Then a silicon oxide layer 173 is formed on the entire surface of the resultant structure by the CVD or the like and etched by the RIE or the like to leave it on the side wall of the monocrystal silicon layer 164.

In this structure, too, when the layer 173 is etched, a silicon nitride layer 163 functions as an etching protection layer, and an underlying layer step can be prevented from being caused due to a decrease in thickness of the silicon oxide layer 162 by etching.

A layer 174 is constituted of boron-doped polysilicon or the like and serves as a gate electrode wiring.

In both FIGS. 16A and 16B, the laminated structure of monocrystal silicon substrate 161, silicon oxide layer (buried insulation layer) 162 and silicon nitride layer (etching protection layer) 163 can be obtained by a bonding method, an ion-implanting method, and the like.

The bonding method is as follows. The silicon oxide layer 162 is formed on the monocrystal silicon substrate 161 by heating in an oxidation atmosphere, and the silicon nitride layer 163 is formed on the entire surface of the layer 162 by the CVD. The surface of the layer 163 is slightly oxidized to form an oxide film thereon, and another monocrystal silicon substrate is bonded to the substrate 161. It is preferable that a native oxide film be eliminated from the surface of the another monocrystal silicon substrate in order to achieve good bonding.

The ion-implanting method is as follows. It is generally known that a silicon oxide layer can be formed as a buried insulation layer by implanting oxygen ions into a monocrystal silicon substrate to a predetermined depth and subjecting the substrate to heat treatment, and a silicon nitride layer can be formed, as an etching protection layer, on the silicon oxide layer by implanting nitrogen ions into the monocrystal silicon substrate more shallowly than implanting the oxygen ions and subjecting the substrate to heat treatment. The nitrogen ions can be implanted before or after the implantation of the oxygen ions.

The present invention is not limited to the above embodiments. For example, it can be applied not only to the n-type MOS transistor of the embodiments but also to a p-type MOS transistor and a CMOS transistor.

In the above embodiments, the boron-doped polysilicon is used as materials for the first gate electrode. However, it can be replaced with phosphorus-diffused polysilicon, conductive materials such as metal having a high melting point, and silicide. Also, the second gate is not limited to WSI and may be formed of a polysilicon doped with a p-type impurity. Furthermore, the SOI substrate is not limited to be formed by a SIMOX method and may be formed by a bonding-wafer method.

Moreover, in the above embodiments, the silicon layer is used for the SOI semiconductor layer. However, another semiconductor layer such as a silicon layer containing germanium can be used.

Furthermore, in the above embodiments, the gate electrode of the two-layered structure is used. However, the present invention can be applied to a gate electrode having a three or more layers.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a silicon-on-insulator (SOI) substrate having an underlying layer formed by a first insulation layer and a semiconductor layer on said underlying layer;
    a plurality of island semiconductor layers formed by selectively dividing said semiconductor layer;
    source and drain regions formed in each of said island semiconductor layers;
    a plurality of gate insulation layers superposed on said island semiconductor layers, respectively;
    a plurality of first gate electrodes superposed on said gate insulation layers, respectively, and each arranged between said source and drain regions;
    a second insulation layer formed on said first insulation layer and surrounding a plurality of laminate structures each made up of one of said island semiconductor layers, one of said gate insulation layers and one of said first gate electrodes, said second insulation layer being flush with each of said first gate electrodes and thicker than a laminate layer made up of one of said island semiconductor layers and one of said gate insulation layers; and
    a second gate electrode formed over both said one of said first gate electrodes and said second insulation layer;
    wherein said one of said island semiconductor layers, said one of said gate insulation layers and said one of said first gate electrodes, which make up each said laminate structures, have a same width.

2. The semiconductor device according to claim 1, wherein said second insulation layer has an entire surface substantially flush with said laminate structures.

3. A semiconductor device comprising:
    a silicon-on-insulator (SOI) substrate having a stacked structure including a semiconductor substrate, a first insulation layer and a monocrystal semiconductor layer;
    a plurality of island semiconductor layers formed on said first insulation layer by selectively etching said semiconductor layer;
    source and drain regions formed in each of said island semiconductor layers;
    a plurality of gate insulation layers superposed on said island semiconductor layers, respectively;
    a plurality of first gate electrodes superposed on said gate insulation layers, respectively and each arranged between said source and drain regions;
    a second insulation layer formed on said first insulation layer and surrounding a plurality of laminate structures each made up of one of said island semiconductor layers, one of said gate insulation layers and one of said first gate electrodes, said second insulation layer being flush with each of said first gate electrodes and thicker than a laminate layer made up of one of said island semiconductor layers and one of said gate insulation layers; and
    a second gate electrode formed over both said one of said first gate electrodes and said second insulation layer, with said second insulation layer being interposed between said first insulation layer and said second gate electrode;

wherein said one of said island semiconductor layers, said one of said gate insulation layers and said one of said first gate electrodes, which make up each said laminate structures, have a same width.

4. The semiconductor device according to claim 3, wherein said second insulation layer has an entire surface substantially flush with said laminate structures.

5. A semiconductor device comprising:

a silicon-on-insulator (SOI) substrate having an underlying layer formed by a first insulation layer and a semiconductor layer on said underlying layer;

a plurality of island semiconductor layers formed by selectively dividing said semiconductor layer;

source and drain regions formed in each of said island semiconductor layers;

a plurality of gate insulation layers superposed on said island layers, respectively;

a second insulation layer formed on said first insulation layer and surrounding a plurality of laminate structures each made up of one of said island semiconductor layers and one of said gate insulation layers, said second insulation layer being thicker than each of said laminate structures; and a gate electrode formed over both said gate insulation layers and said second insulation layer with said second insulation layer being interposed between said first insulation layer and said gate electrode, wherein said gate electrode is entirely flattened.

6. The semiconductor device according to claim 5, wherein said second insulation layer has an entire surface substantially flush with said laminate structures.

7. A semiconductor device comprising:

a silicon-on-insulator (SOI) substrate having an underlying layer formed by a first insulation layer and a semiconductor layer on said underlying layer;

a plurality of island semiconductor layers formed by selectively dividing said semiconductor layer;

source and drain regions formed in each of said island semiconductor layers;

a plurality of gate insulation layers superposed on said island layers, respectively;

a plurality of first gate electrodes superposed on said gate insulation layers, respectively, and each arranged between said source and drain regions; and a second insulation layer formed on said first insulation layer and surrounding a plurality of laminate structures each made up of one of said island semiconductor layers, one of said gate insulation layers and one of said first gate electrodes, said second insulation layer having an entire surface substantially flush with said laminate structures and being thicker than a laminate layer made up of one of said island semiconductor layers and one of said gate insulation layers.

* * * * *